United States Patent [19]
Matsubara

[11] Patent Number: 5,952,736
[45] Date of Patent: Sep. 14, 1999

[54] PULSE OUTPUT CIRCUIT

[75] Inventor: Yoshiaki Matsubara, Kanagawa, Japan

[73] Assignee: Sony Corporation, Japan

[21] Appl. No.: 09/154,768

[22] Filed: Sep. 17, 1998

[30] Foreign Application Priority Data

Sep. 19, 1997 [JP] Japan ..................... 9-255407

[51] Int. Cl.$^6$ ............ H03K 3/00; H03K 17/04; H03K 17/60
[52] U.S. Cl. ............ 307/106; 327/374; 327/112; 327/488; 327/491
[58] Field of Search ................... 327/374, 382, 327/387, 112, 488, 491, 335, 530; 307/106, 108, 109

[56] References Cited

U.S. PATENT DOCUMENTS

| | | | |
|---|---|---|---|
| 4,733,153 | 3/1988 | Katzenstein | 307/109 |
| 4,874,970 | 10/1989 | Coy et al. | |
| 5,414,382 | 5/1995 | Larson et al. | 327/561 |
| 5,550,501 | 7/1996 | Ito et al. | 327/374 |

FOREIGN PATENT DOCUMENTS 0 511 646 A1  11/1992  European Pat. Off. .
0 614 280 A1  9/1994   European Pat. Off. .

*Primary Examiner*—Richard T. Elms
*Assistant Examiner*—Roberto J. Rios
*Attorney, Agent, or Firm*—Ronald P. Kananen; Rader, Fishman & Grauer

[57] ABSTRACT

A pulse output circuit which has an output stage connected to a capacitive load capable of improving a through-rate of an input pulse signal with reduced power consumption is provided. A circuit having a first transistor which is supplied with a base current at its base in accordance with an input pulse signal from an input terminal, which is supplied with a power source voltage at the collector, which has an emitter connected to the output terminal, and which supplies current to a capacitive load; a third transistor which has a collector connected to the emitter of the first transistor and which has an emitter which is grounded; a bias means which supplies a predetermined base current to the base of the third transistor to make it conductive; and a differentiating circuit which outputs a signal to reduce the base current of the second transistor at the rising edge of the pulse to make it non-conductive and to increase the base current of the second transistor at the trailing edge of the pulse to increase the current.

9 Claims, 7 Drawing Sheets

PRIOR ART

PULSE OUTPUT CIRCUIT

BACKGROUND OF THE INVENTION

1. Field of the Invention

The present invention relates to a pulse output circuit which converts, for example, an input pulse signal to a predetermined level and supplies it to a circuit having a high capacitive load.

2. Description of the Related Art

For example, normally an amplifying circuit such as a video signal amplifying circuit in a computer display monitor handles a pulse signal including signal components of a wide bandwidth up to several hundreds of mega-hertz (MHz).

In the above amplifying circuit, it is sometimes necessary to buffer a pulse signal input to the amplifying circuit with a high through-rate so as to drive a circuit having a high capacitive load. For example, in the case of a video signal of a computer display monitor, the video signal cannot be faithfully reproduced on the computer display monitor if the pulse signal cannot be output at a high through-rate.

Here, as shown in FIG. 9, consider a circuit having a gain control amplifying circuit 50 which buffers a pulse signal and outputs it to a circuit having a high capacitive load $C_0$ provided at the following stage.

An input pulse signal $S_{IN}$ is input to a gain control circuit 51 in which the gain is automatically controlled and then is output to an output buffer circuit 52 as a pulse signal of a constant level.

The output buffer circuit 52 converts the input pulse signal having a predetermined level and outputs a pulse signal $S_{OUT}$ to a circuit having a high capacitive load $C_0$ provided at the following stage.

FIGS. 1 and 2 are views of specific examples of the output buffer 52.

The output buffer circuit shown in FIG. 1 is connected to a circuit having a high capacitive load $C_0$ at the output stage and is comprised of npn-type transistors Q51 to Q54 and a resistor R51.

In FIG. 1, an emitter of the transistor Q51 and a collector of the transistor Q52 are connected and a collector of the transistor Q51 is connected to a supply line of a power source voltage vcc.

A base of the transistor Q51 is connected to an input terminal $T_{IN}$.

Bases of transistors Q52 and Q54 are mutually connected and a direct current (DC) voltage is applied to them.

An emitter of the transistor Q52 is connected to a ground line GND.

A collector of the transistor Q53 is connected to the supply line of the power source voltage VCC, and an emitter of the transistor Q53 is connected to a collector of the transistor Q54.

One end of the resistor R51 is connected to the base of the transistor Q53 and the other end thereof is connected to the connection line of the emitter of the transistor Q51 and the collector of the transistor Q52.

The collector of the transistor Q53 is connected to the supply line of the power source voltage VCC.

The connection line of the emitter of the transistor Q53 and the collector of the transistor Q54 is connected to the output terminal $T_{OUT}$.

One end of the capacitive load $C_0$ is connected to the output terminal $T_{OUT}$ and the other end thereof is connected to the ground line GND.

In the circuit shown in FIG. 1, the transistors Q51 and Q53 are formed as emitter-follower circuits and the transistors Q53 and Q54 have sufficiently larger current driving abilities compared with other transistors Q51 and Q52. A bias voltage is applied to the bases of the transistors Q52 and Q54, and the transistors Q52 and Q54 are in a conductive state.

In the circuit shown in FIG. 1, when a pulse signal $S_{IN}$ having the waveform shown in FIG. 6 is input to the input terminal $T_{IN}$, a current $i_0$ flows to the register R51, a base bias current flows to the base of the transistor Q53, and an emitter current $i_1$ at the transistor Q53 increases.

Since the current driving ability of the transistor Q54 is smaller than that of the transistor Q53, a part of the emitter current $i_1$ flows into the transistor Q54 and the remaining current flows into the capacitive load $C_0$, therefore, the capacitive load $C_0$ is charged.

The output voltage at the output terminal $T_{OUT}$ changes as shown in the portion (1) in FIG. 6.

At a trailing edge of the pulse signal $S_{IN}$, the supply of the emitter current at the transistor Q1 sharply falls so that the capacitive load $C_0$ is no longer charged. The charge in the capacitive load $C_0$ is discharged to the ground line GND through the transistor Q54. At this time, the output terminal $T_{OUT}$ and the output voltage $S_{OUT}$ change as shown in the portion (2) in FIG. 6.

Accordingly, when the amount of the collector current of the transistor Q54 is small and the capacitance of the capacitive load $C_0$ is large, there is a disadvantage that the through-rate during the fall of the pulse signal $S_{IN}$ deteriorates further.

Also, since current is always flowing from the emitter of the transistor Q54, there is a disadvantage that the power consumption becomes relatively high.

FIG. 2 shows a circuit comprised of the circuit shown in FIG. 1 where the transistor Q54 is replaced by the resistor R52.

In the case of the circuit shown in FIG. 2, the time required for discharging the capacitive load $C_0$ at the trailing edge of the pulse signal $S_{IN}$ is determined by a time constant determined by the capacitive load $C_0$ and the resistor R52.

Accordingly, by setting the time constant determined by the capacitive load $C_0$ and the resistor R52 short, the through-rate at the trailing edge of the pulse signal $S_{IN}$ improves.

However, the power consumption by the resistor R52 and the transistor Q53 becomes large, which is not preferable in configuring a circuit.

SUMMARY OF THE INVENTION

An object of the present invention is to provide a pulse output circuit in which a capacitive load is connected at its output stage and capable of improving a through-rate of an input pulse signal with a reduced power consumption.

According to the present invention, there is provided a pulse output circuit connected to an output terminal and outputting a pulse signal to a capacitive load connected to the output terminal in response to an input pulse signal, comprising a first transistor connected to the output terminal and supplied at its base with the input pulse signal; a second transistor connected between the output terminal and a reference potential; a biasing means for supplying a predetermined base current to a base of the second transistor to place the second transistor in a conductive state; and a base current control means for reducing the base current of the second transistor in a predetermined period when the level of the input pulse signal is rising to place the second transistor in a non-conductive state and for increasing the base current of the second transistor in a predetermined period when the level of the input pulse signal is falling to place the second transistor in a conductive state.

In the present invention, when the pulse signal is input from the input terminal, the first transistor becomes conductive. The second transistor is made conductive by the bias means, and the current output from the first transistor is supplied to the capacitive load and also tries to pass through the second transistor. At this time, since a base current control means makes the second transistor not conductive for a predetermined period, current does not flow in the second transistor and all is supplied to the capacitive load, therefore the potential which appears at the output terminal rises abruptly.

When the pulse signal falls, the first transistor becomes non-conductive and the current supply to the capacitive load is cut off. At this time, a base current at the second transistor rises for a predetermined period to increase the current flowing in the second transistor.

The charge in the capacitive load is abruptly discharged from the collector of the second transistor through the emitter.

As a result, the potential generated between the output terminal and the reference potential falls rapidly and the through-rate improves.

Further, the pulse output includes a reset circuit for discharging a charge stored in a parasitic capacitance formed in the first transistor when the level of the input pulse signal is falling.

Preferably, the reset circuit comprises a third transistor having a collector connected to the base of the first transistor, an emitter connected to the ground, and a base supplied with a signal from the base current control means.

The third transistor is made conductive by the output signal from the base current control means when the input pulse signal falls. The charge emitted from a parasitic capacitance possessed by the first transistor is emitted to the third transistor.

As a result, the transition from a conductive state to a non-conductive state in the first transistor caused by the fall of the input pulse signal is quick. Therefore, it becomes possible to suppress the amount of current that passes through the first and the second transistors during the transitional period from the conductive state to the non-conductive state and the power consumption can be kept low.

Further, the pulse output circuit includes a buffer circuit including an emitter-follower circuit for outputting a base current of a predetermined value in accordance with the input of the input pulse signal to the base of the first transistor.

A suitable base current can be input to the base of the first transistor by a buffer circuit in accordance with the input pulse.

The base current control mean includes an inverter circuit for inverting a level of the input pulse signal and a differentiating circuit for differentiating an output signal of the inverter circuit and outputting the differentiated signal as a current to the base of the second transistor.

By differentiating a signal output from the inverter circuit by the differentiating circuit, a negative direction spike-like current signal is generated at the rising edge of the input pulse signal, while a positive-direction spike-like current signal is generated at to the trailing edge of the input pulse signal.

By inputting these signals to the base of the first transistor, the base current at the second transistor is reduced for a predetermined period at the rising edge of the input pulse signal, while the base current of the second transistor is increased for a predetermined period at the trailing edge of the input pulse signal.

Further, the pulse output circuit includes a level adjusting circuit which adjusts the level of the output signal of the inverter circuit at a preceding stage of the differentiating circuit.

The level adjusting circuit can adjust the size of a signal given to the base of the second transistor and can adjust the level of the current signal generated by the differentiating circuit. As a result, the degree of sharpness of charging and discharging to and from the capacitive load can be adjusted.

The differentiating circuit includes first and second differentiating circuits which differentiate the output signal of the inverter circuit and independently output the differentiated signals as currents to the bases of the second and third transistors.

With the above configuration, it is possible to control the base current independently for the second and the third transistors.

BRIEF DESCRIPTION OF THE DRAWINGS

These and other objects and features of the present invention will become clearer from the following description of the preferred embodiments given with reference to the accompanying drawings, in which.

DESCRIPTION OF THE PREFERRED EMBODIMENTS

Below, preferred embodiments will be described with reference to the accompanying drawings.

Figure 1:
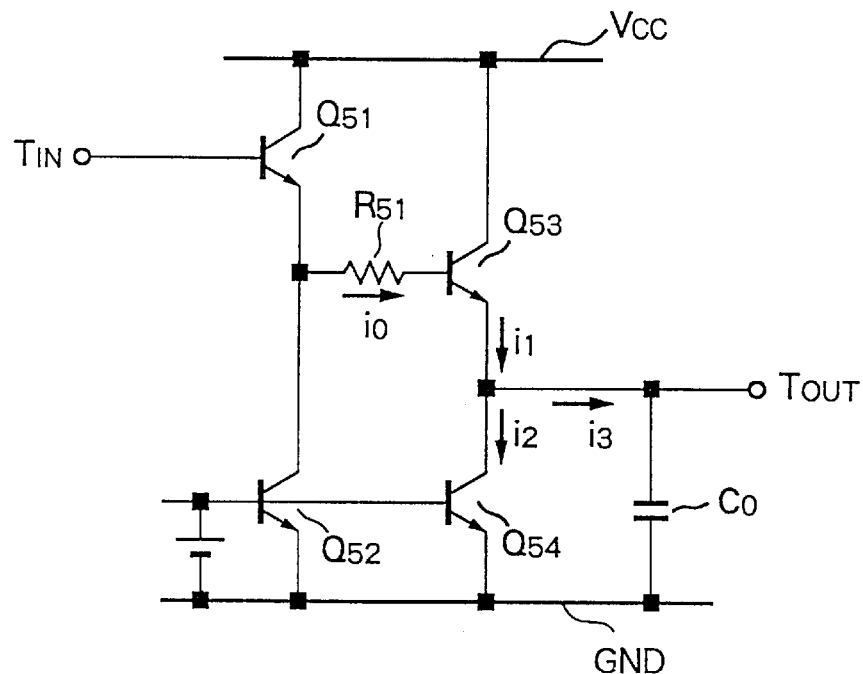
FIG. 1 is a circuit diagram of an example of a pulse output circuit of the related art.
Figure 2:
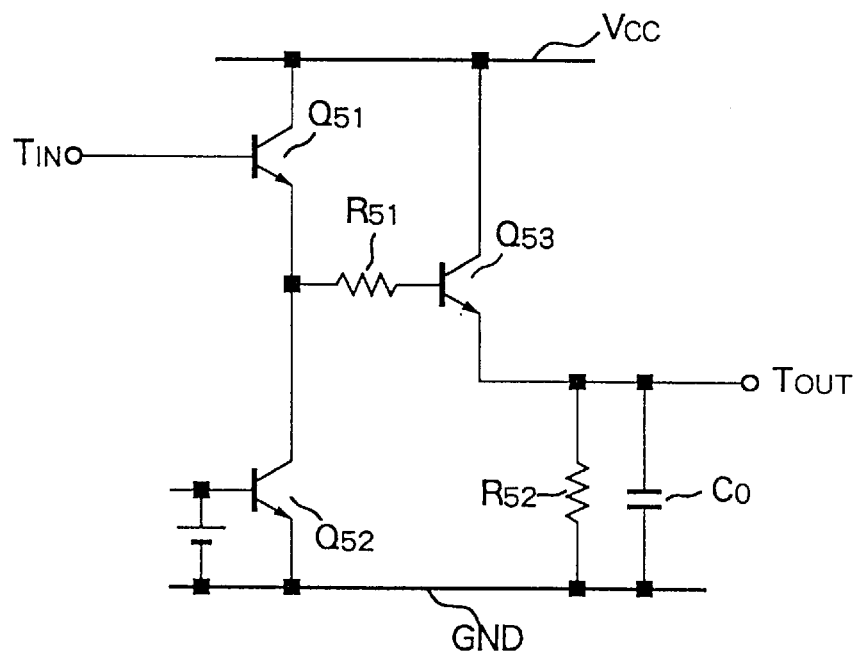
FIG. 2 is a circuit diagram of another example of a pulse output circuit of the related art.
Figure 3:
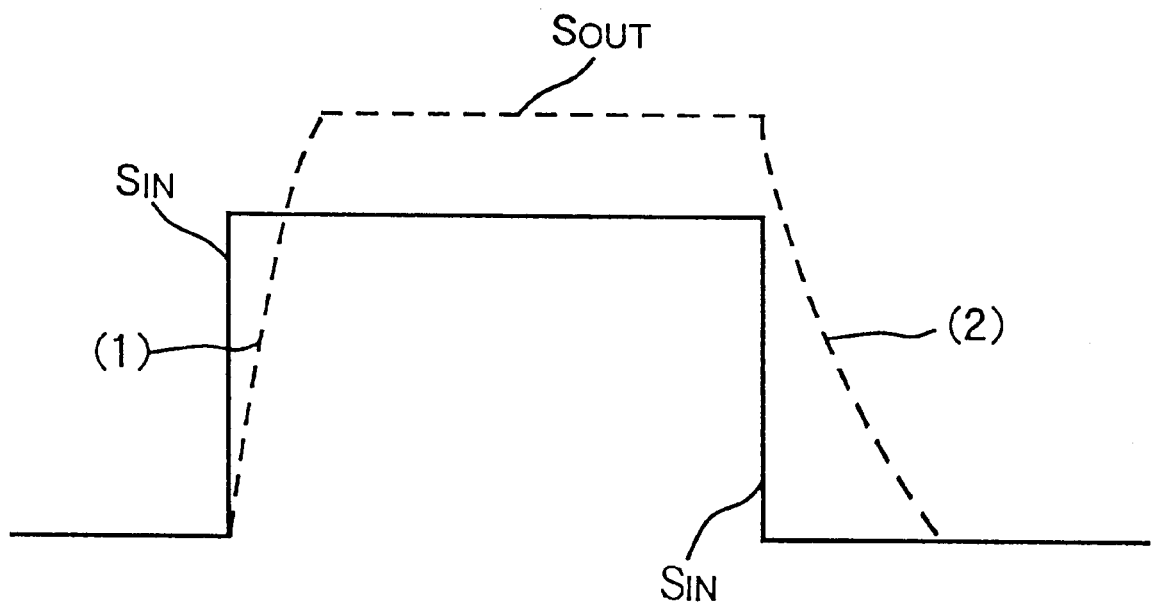
FIG. 3 is an explanatory view of relationships between an input pulse and an output pulse.
Figure 4:
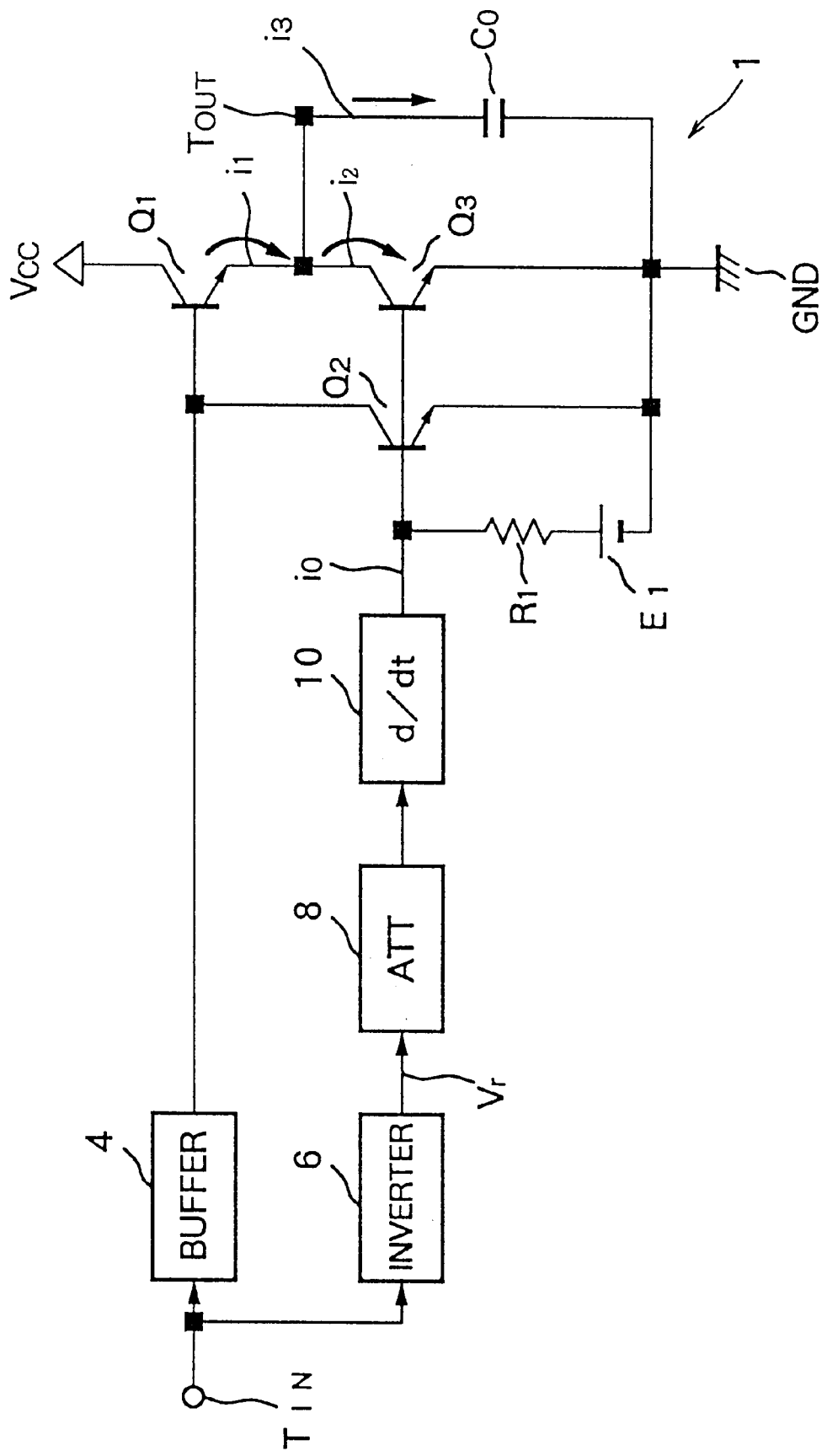
FIG. 4 is a view of the configuration of a pulse output circuit according to a first embodiment of the present invention.

FIG. 4 is a view of the configuration of an embodiment of a pulse output circuit of the present invention.

The pulse output circuit 1 shown in FIG. 4 comprises a buffer circuit 4, an inverter circuit 6, an attenuation circuit 8, a differentiating circuit 10, npn-type transistors Q1, Q2, and Q3, a resistor R1, and a constant voltage source El.

The buffer circuit 4 and the inverter circuit 6 are connected to the input terminal $T_{IN}$, the output of the buffer circuit 4 is connected to the base of the transistor Q1, and the output of the inverter circuit 6 is connected to the input of the attenuation circuit 8.

The output of the attenuation circuit 8 is connected to the input of the differentiating circuit 53 and the output of the differentiating circuit 10 is connected to the base of the transistor Q2 and one end of the resistor R1.

The other end of the resistor R1 is connected to the positive terminal of the direct current power source E1 and the negative terminal of the direct current power source E1 is grounded to the ground GND.

The collector of the transistor Q2 is connected to the connection line connecting the buffer circuit 4 and the base of the transistor Q1, and the emitter of the transistor Q2 is grounded to the ground GND.

The power source voltage Vcc is supplied to the collector of the transistor Q1, and the emitter is connected to the output terminal $T_{OUT}$ as well as to the collector of the transistor Q3.

The base of the transistor Q3 is connected to the output of the differentiating circuit 10, and the emitter is grounded to the ground GND.

One end of the capacitive load $C_0$ is connected to the output terminal $T_{OUT}$, and the other end is connected to the ground GND.

The buffer circuit 4 outputs a base current of a predetermined value to the base of the transistor Q1 in accordance with the pulse signal input from the input terminal $T_{IN}$.

The inverter circuit 6 inverts the pulse signal input to the input terminal $T_{IN}$ and outputs the result.

The attenuation circuit 8 adjusts the signal output from the inverter 6 to a predetermined level and outputs it to the differentiating circuit 10.

The differentiating circuit 10 differentiates the input signal and outputs it as a current.

Next, the operation of the pulse output circuit having the above configuration will be explained.

A forward direction bias current is supplied to the bases of the transistors Q2 and Q3 by the direct current (DC) power source E1 and the resistor R1 before a pulse signal $S_{IN}$ of a predetermined level is input to the input terminal $T_{IN}$, therefore the transistors Q2 and Q3 are in a conductive state. However, since the transistor Q1 is in a non-conductive state, current does not flow into the transistors Q2 and Q3 and there is no power consumption.

Rising Edge of Pulse

Figure 6:
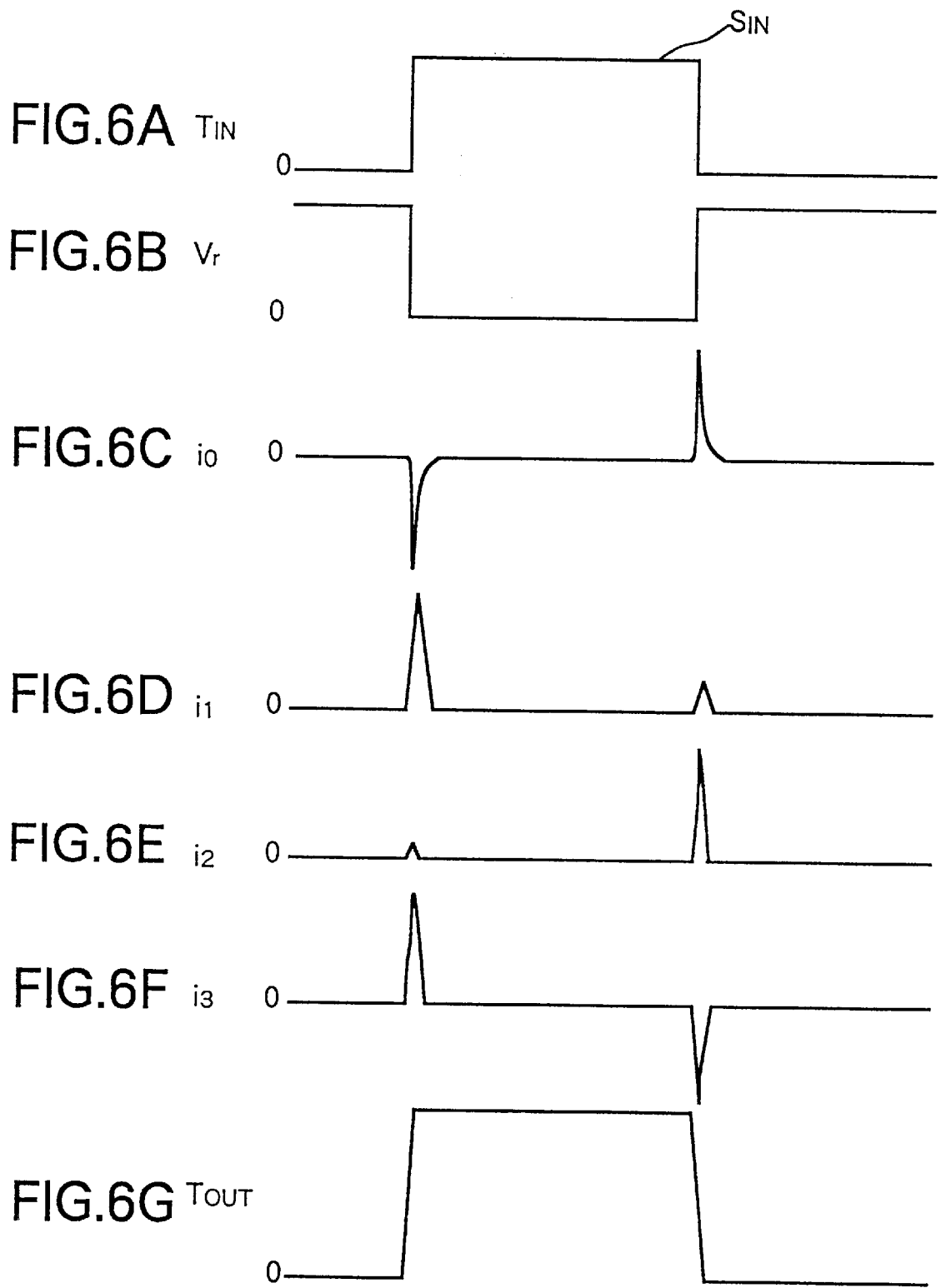
FIGS. 6A–6G are timing charts of the output conditions of respective portion of the circuit shown in FIG. 7.

As shown in FIG. 6A, when a pulse signal $S_{IN}$ of a predetermined level is input to the input terminal $T_{IN}$, an output signal Vr of the inverter circuit 6 becomes the shape shown in FIG. 6B.

The output signal Vr output from the inverter circuit 6 is converted to a predetermined level in the attenuation circuit 8, differentiated in the differentiating circuit 10, and output as a current signal $i_0$.

The waveform of the current signal $i_0$ becomes, as shown in FIG. 6C, a negative direction spike-shape at the rising edge of the pulse signal $S_{IN}$, and a positive direction spike-shape at the trailing edge of the pulse signal $S_{IN}$.

A base current signal is input to the transistor Q1 from the buffer circuit 4 at the rising edge of the pulse signal $S_{IN}$ and the transistor Q1 becomes conductive.

As a result, a current shown in FIG. 6D is output from the emitter of the transistor Q1.

At the rising edge of the pulse signal $S_{IN}$, the current from the emitter of the transistor Q1 tends to branch and flow into the capacitive load $C_0$ and transistor Q3.

In the transistor Q3, the negative direction spike-like bias current shown in FIG. 6C is supplied from the differentiating circuit 10.

Accordingly, the forward direction bias current supplied by the direct current power source E1 and the resistor R1 is canceled out by the negative direction spike-like bias current, and the transistor Q3 becomes non-conductive.

As a result, only a small amount of current flows to the collector of the transistor Q3 as shown in FIG. 6E.

The small amount of current flowing to the collector of the transistor Q3 is a current caused by a parasitic capacitance possessed by the transistor Q3 which flows while the transistor Q3 shifts from the conductive state to the non-conductive state.

At the rising edge of the pulse signal $S_{IN}$, the negative direction spike-like bias current shown in FIG. 6C is supplied to the base of the transistor Q2 from the differentiating circuit 10, therefore the transistor Q2 also becomes conductive.

The current $i_3$ which is branched from the current i output from the emitter of the transistor Q1 to the capacitive load $C_0$ becomes the waveform shown in FIG. 6F, thus the majority of the current i output from the emitter of the transistor Q1 is supplied to the capacitive load $C_0$.

When the capacitive load $C_0$ is charged, the voltage appearing at the output terminal $T_{OUT}$ comes to have a waveform shown in FIG. 6G.

Trailing Edge

When the pulse signal $S_{IN}$ falls, the transistor Q1 becomes non-conductive.

Due to this, the charge in the capacitive load $C_0$ is discharged to the ground GND through the transistor Q3.

At this time, as shown in FIG. 6C, the current signal $i_0$ output from the differentiating circuit 10 exhibits a positive direction spike-shape.

Accordingly, in addition to the supply of a forward direction bias current by the direct current power source E1 and the resistor R1 to the base of the transistor Q3, a positive direction spike-like current is supplied, therefore the current flowing at the collector of the transistor Q3 increases as shown in FIG. 6E.

As a result, the charge in the capacitive load $C_0$ is swiftly discharged and the waveform at the trailing edge of the voltage which appears at the output terminal $T_{OUT}$ becomes one of a very sharp increase, as shown in FIG. 6G.

At the trailing edge of the pulse signal $S_{IN}$, since the transistor Q1 and the buffer circuit 4 have parasitic capacitances, the charges in these parasitic capacitances are discharged and a through current tends to flow to the transistors Q1 and Q3.

A flow of a through current occurs, for example, because of an internal feedback of the charge in the parasitic capacitance at the collector side of the transistor Q1 to the base side and because of a flow of charge in the parasitic capacitance possessed by the buffer circuit 4 to the base of the transistor Q1.

However, since the transistor Q2 becomes conductive by being biased by a positive direction spike-like current, the charges from the parasitic capacitances of the transistor Q1 and the buffer circuit 4 are discharged to the ground GND by the transistor Q2 and the flow of a through current in the transistors Q1 and Q3 is prevented.

As explained above, according to the present embodiment, by forcibly supplying a negative bias current to the base of the transistor Q3 from the differentiating circuit 10 at a rising edge of the pulse signal $S_{IN}$, the transistor Q3 swiftly shifts from a conductive state to a non-conductive state. Thus, the charging rate to the capacitive load $C_0$ becomes high.

Also, since no direct current flows into the transistor Q3 during the charging to the capacitive load $C_0$, it is possible to reduce the power consumption at the rising edge of the pulse signal $S_{IN}$.

Furthermore, at the trailing edge of the pulse signal $S_{IN}$, by increasing the amount of driving current of the transistor Q3 by adding a bias current to the base of the transistor Q3, it is possible to quickly release the charge in the capacitive load $C_0$ through the transistor Q3.

As a result, the waveform at the trailing edge of the voltage which appears at the output terminal becomes sharp and it becomes possible to improve the through-rate of the pulse signal $S_{IN}$.

Further, according to the present embodiment, by providing the transistor Q2, it is possible to prevent a through current from flowing in the transistors Q1 and Q3 due to a current released from the parasitic capacitances of the transistor Q1 and the buffer circuit 4 at the trailing edge of the pulse signal $S_{IN}$ and to suppress deterioration of the through-rate at the trailing edge of the pulse signal $S_{IN}$ and thereby to reduce the power consumption.

Also, according to the present embodiment, since it is possible to adjust the level of the current signal output from the differentiating circuit 10 by the attenuation circuit 8, the degree of sharpness of charging and discharging at the capacitive load $C_0$ is adjustable, and the base current of the transistors Q2 and Q3 can be freely and easily controlled by the attenuation circuit 8 and the differentiating circuit 10.

Figure 5:
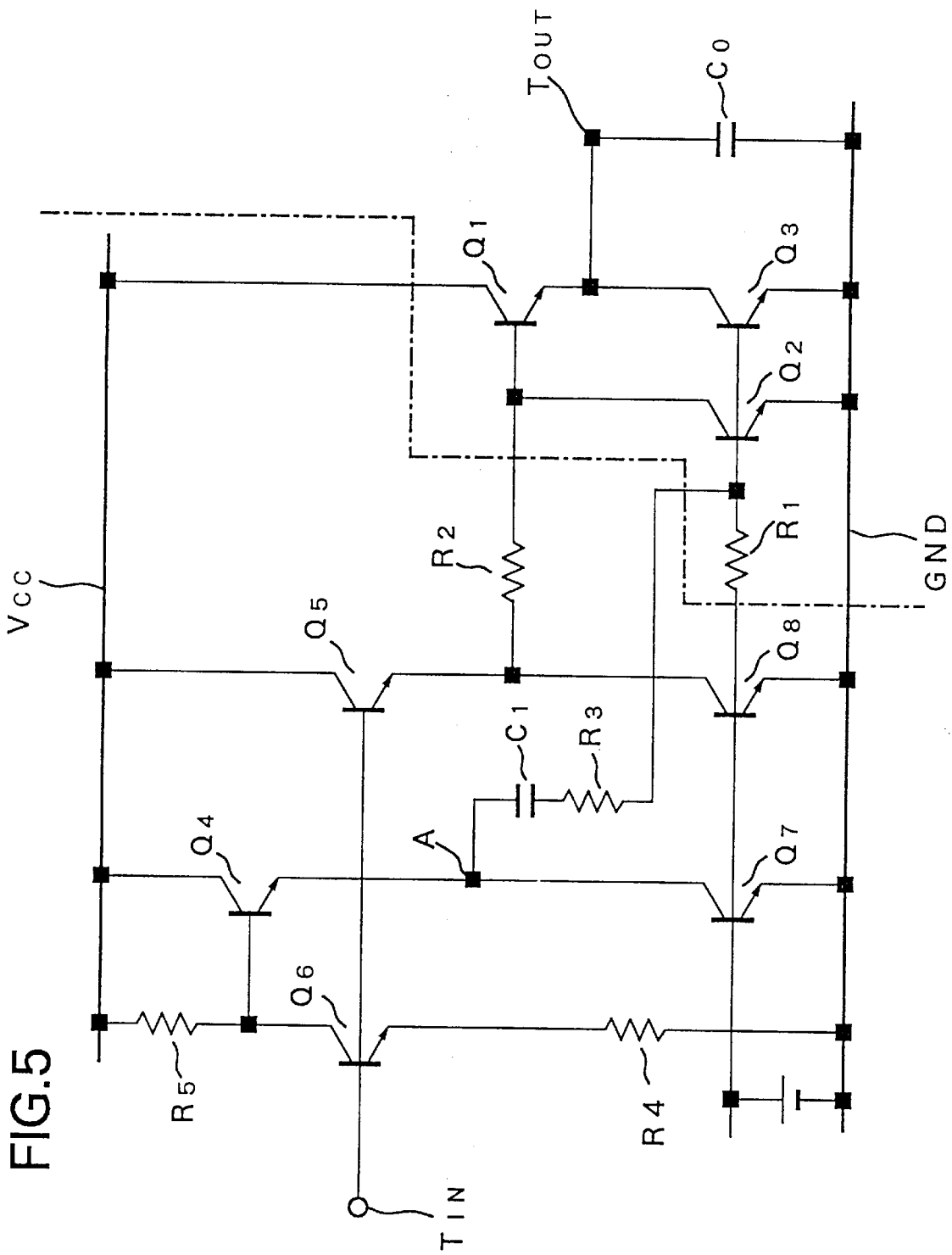
FIG. 5 is a circuit diagram of a specific example of a circuit which realizes the circuit configuration of FIG. 7.
Figure 7:
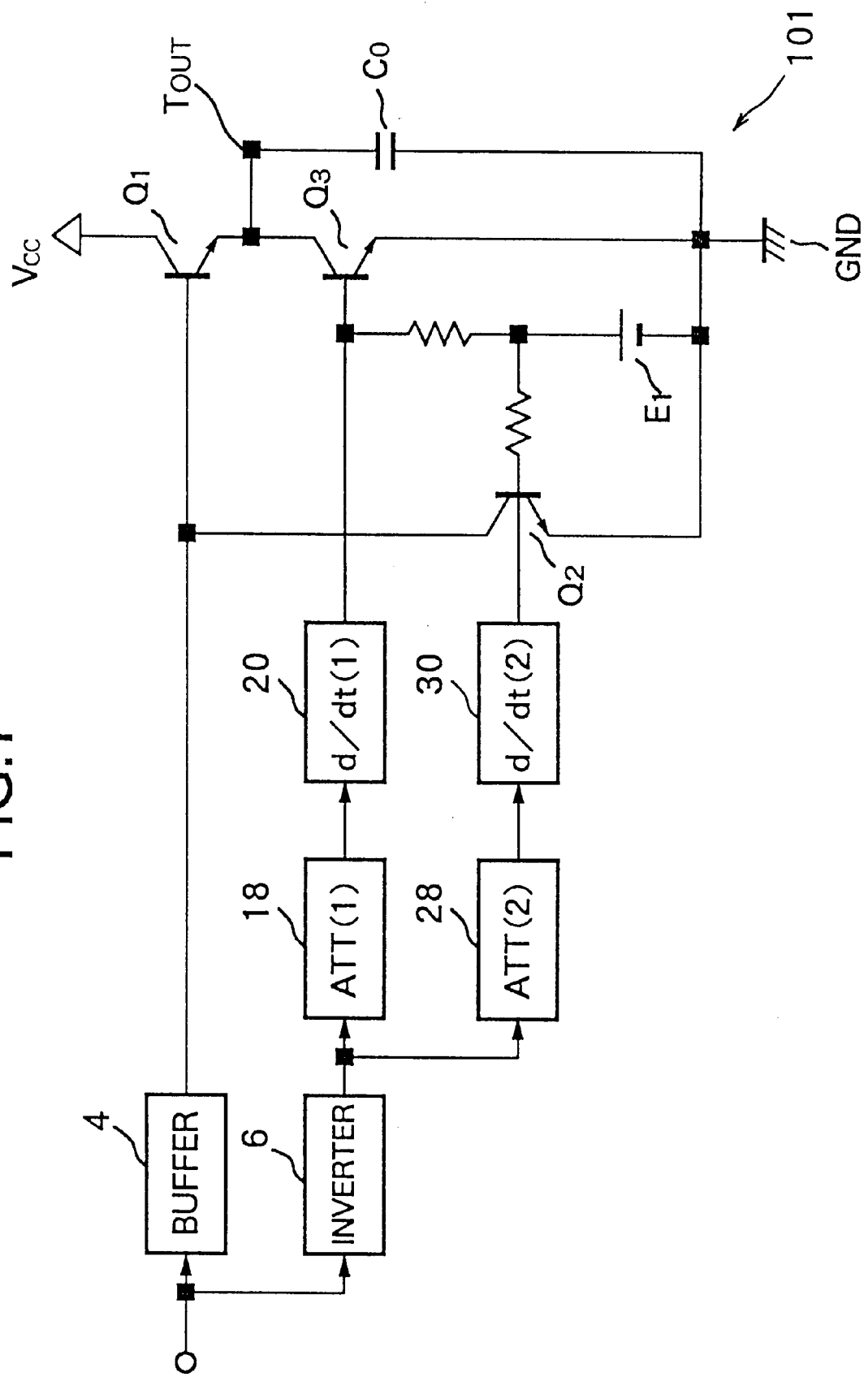
FIG. 7 is a view of the configuration of a second embodiment of the present invention.

FIG. 5 is an explanatory view of a specific example of a pulse output circuit having the configuration shown in FIG. 7. The circuit at the left side of the dotted line comprises a buffer circuit 4, an inverter circuit 6, an attenuation circuit 8, a differentiating circuit 10, and a direct current power source E1.

In FIG. 5, an npn-type transistor Q6 is connected to the input terminal $T_{IN}$, bases of the npn-type transistors Q7, and Q8 are mutually connected as well as connected to one end of a resistor R1, and a direct current voltage is applied to the bases of the transistors Q7, and Q8.

The collector of the transistor Q6 is connected to the power source voltage Vcc via a resistor R5, and the emitter is connected to the ground line GND via a resistor R4.

A base of the transistor Q4 is connected to the connection line of the collector of the transistor Q1 and the resistor R5, the collector is connected to the power source voltage Vcc, and the emitter is connected to the collector of the transistor Q7.

The collector of the transistor Q7 is connected to the emitter of the transistor Q4 and the emitter is connected to the ground line GND.

One end of a capacitor C1 is connected to the connection line of the emitter of the transistor Q4 and the collector of the transistor Q7, and the other end is connected to one end of the resistor R3.

The other end of the resistor R3 is connected to the connection line of the resistor R1 and the base of the transistor Q2.

The collector of the transistor Q5 is connected to the power source voltage Vcc, and the emitter is connected to the collector of the transistor Q8.

The emitter of the transistor Q8 is connected to the ground line GND.

One end of the resistor R2 is connected to the connection line of the emitter of the transistor Q5 and the collector of the transistor Q8, and the other end is connected to the base of the transistor Q1.

In a circuit having the above configuration, the transistor Q5 forms an emitter-follower circuit, and the buffer circuit 4 is composed of the transistor Q5 and the resistor R2.

When a pulse signal $S_{IN}$ is input to the input terminal $T_{IN}$, the transistors Q5 and Q8 become conductive, and a current flows to the resistor R2 and is supplied to the base of the transistor Q1 as a base current.

The transistor Q4 becomes conductive due to the supply of a current to the base through the resistor R5 when the pulse signal $S_{IN}$ is falling. When the pulse signal $S_{IN}$ is rising, the transistor Q6 becomes conductive, so a base current is not supplied and the above transistor becomes non-conductive.

Accordingly, when the pulse signal $S_{IN}$ is falling, the capacitor C1 is charged and the potential of the connection point A side rises, however, but this does not reach the power source voltage Vcc.

When the pulse signal $S_{IN}$ rises from this state, the charge at the capacitor C1 flows to the ground line GND through the transistor Q7. When the capacitor C1 discharges, the potential of the connection point A side falls, however, does not reach the ground level.

Namely, the potential of the connection point A side has an inversed polarity and a changed level to the pulse signal $S_{IN}$. An inverter circuit 6 is realized by this.

The waveform of the current flowing in the base of the transistor Q2 becomes a waveform of the voltage at the connection point A differentiated by the resistor R1 and the capacitor C1, that is, the spike-shaped waveform shown in FIG. 6C. By this, the differentiating circuit 10 is realized.

At this time, the level of the current supplied to the base of the transistor Q2 is determined by the ratio of the resistance values of the resistor R3 and the resistor R1. Namely, by adjusting the ratio of the resistance values of the resistors R1 and R3, the level of the spike-like current waveform shown in FIG. 6C can be adjusted.

By this, the attenuation circuit 8 is realized.

When the pulse signal $S_{IN}$ has fallen, the transistor Q4 is in a conductive state and the capacitor C1 is charged, accordingly the bases of the transistors Q2 and Q3 are supplied with a bias current and the transistors Q2 and Q3 are in a conductive state. By this, the direct current power source E1 is realized.

As explained above, in the pulse output circuit shown in FIG. 5, the transistors used in the circuit may all be npn-type transistors.

In a so-called push-pull type circuit in which both an npn-type transistor and a pnp-type transistor are ordinarily used, an npn-type and a pnp-type transistor having high quality high-frequency characteristics and uniform performance are required. Manufacture of such an IC is difficult and costly.

An IC having only npn-type transistors is relatively inexpensive and features only a slight difference in the performance between the transistors as well.

Accordingly, the pulse output circuit of the present invention can be manufactured with a relatively inexpensive cost and differences of performance between circuits can be easily suppressed.

Figure 8:
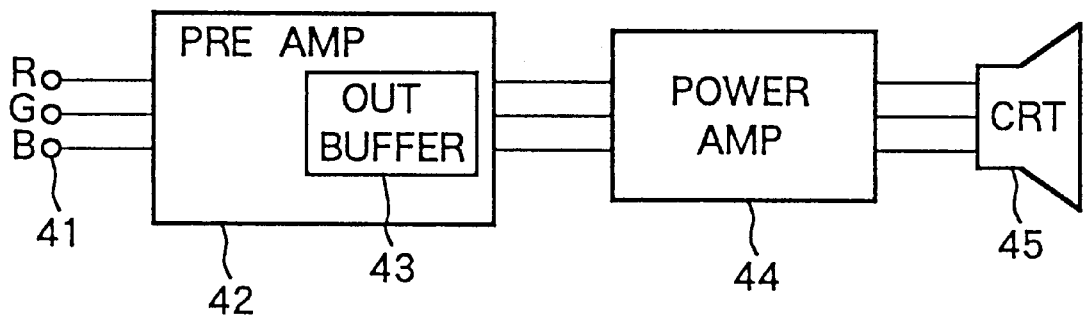
FIG. 8 is a view of the configuration of a CRT driving system.
Figure 9:
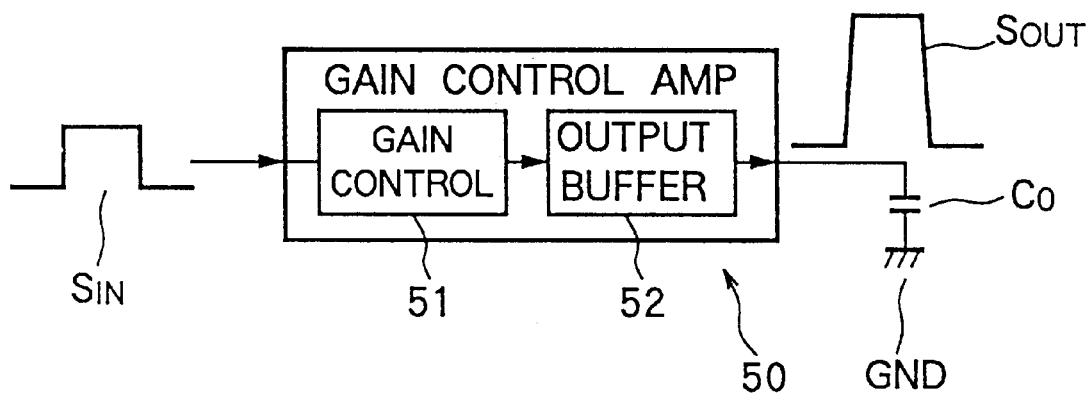
FIG. 9 is an explanatory view of an example of a circuit which buffers a pulse signal and outputs it to a following circuit having a high capacitive load.

The pulse output circuit 1 according to the present embodiment is applied to a system (apparatus) for driving a cathode ray tube (CRT) as shown in FIG. 8.

The CRT driving system shown in FIG. 8 is receives as input, for example, a pulse video signal having a very wide bandwidth from an RGB terminal 41. A signal having a level of, for example, about 0.7V is converted to have a level of about 4 to 5V at a pre-amplifier and output to a power amplifier 44.

The power amplifier comprises a high capacitive load and amplifies a signal output from the pre-amplifier 42 to a level of, for example, a voltage of a multiple of 10 and outputs it to the CRT 45.

The pulse output circuit 1 according to the present embodiment is applied as an output buffer 43 provided in the output stage of the pre-amplifier 42.

The capacitive load possessed by the power amplifier 44 corresponds to the capacitive load $C_0$ in FIGS. 7 and 8.

A video signal includes a frequency of up to about several hundreds of MHz. The performance at the trailing edge of such a high-frequency pulse signal can be improved by applying the pulse output circuit 1 of the present embodiment. The power consumption can be suppressed as well.

As a result, there is no distortion of the video signal and it becomes possible to reproduce a faithful picture on the CRT.

Second Embodiment

FIG. 7 is a circuit diagram of a second embodiment of the pulse output circuit of the present invention.

In the pulse output circuit 1 shown in FIG. 7, the base currents of the transistors Q2 and Q3 were controlled by the attenuation circuit 8 and the differentiating circuit 10.

However, the pulse output circuit 101 shown in FIG. 7 is different in the point that first and second attenuation circuits 18 and 28 and differentiating circuits 20 and 30 are provided to control the base currents of the transistors Q2 and Q3 independently.

The transistor Q3 is provided for releasing the charge in the capacitive load $C_0$, and the transistor Q2 is provided for releasing the charges in the parasitic capacitance of the transistor Q1 and the parasitic capacitance of the buffer circuit 4.

Normally, the capacitive load $C_0$ and the parasitic capacitances of the transistor Q1 and the buffer circuit 4 are different in size.

Therefore, if the base currents of the transistor Q2 and Q3 are the same, there may conceivably arise a case where the charges in the capacitive load $C_0$ and the parasitic capacitances of the transistor Q1 and the buffer circuit 4 cannot be discharged.

In the present embodiment, by providing the first and second attenuation circuits 18 and 28 and differentiating circuits 20 and 30, the base currents of the transistors Q2 and Q3 can be independently controlled and the charges in the capacitive load $C_0$ and the parasitic capacitances of the transistor Q1 and the buffer circuit 4 can be properly discharged at the same time.

According to the present invention, it is possible to improve the through-rate of an input pulse signal.

Also, according to the present invention, it is possible to reduce the power consumption at a rising edge and a trailing edge of the pulse signal.

Furthermore, according to the present invention, an npn-type transistor can be use for all the transistors of the conductive type used in the circuit, the circuit performance can be made uniform, and the manufacturing cost can be reduced.

Note that the present invention is not limited to the above embodiments and includes modifications within the scope of the claims.

What is claimed is:

1. A pulse output circuit connected to an output terminal and outputting a pulse signal to a capacitive load connected to the output terminal in response to an input pulse signal, said pulse output circuit comprising:

a first transistor connected to the output terminal and supplied at its base with the input pulse signal;

a second transistor connected between the output terminal and a reference potential;

a biasing means for supplying a predetermined base current to a base of the second transistor to place the second transistor in a conductive state; and a base current control means for reducing the base current of the second transistor in a predetermined period when the level of the input pulse signal is rising to place the second transistor in a non-conductive state and for increasing the base current of the second transistor in a predetermined period when the level of the input pulse signal is falling to place the second transistor in a conductive state.

2. A pulse output circuit according to claim 1, further comprising a reset circuit for discharging a charge stored in a parasitic capacitance formed in the first transistor when the level of the input pulse signal is falling.

3. A pulse output circuit according to claim 2, wherein the reset circuit comprises a third transistor having a collector connected to the base of the first transistor, an emitter connected to the ground, and a base supplied with a signal from the base current control means.

4. A pulse output circuit according to claim 1, wherein the first to third transistor have npn-type conductivities.

5. A pulse output circuit according to claim 1, further comprising a buffer circuit including an emitter-follower circuit for outputting a base current of a predetermined value in accordance with the input of the input pulse signal to the base of the first transistor.

6. A pulse output circuit according to claim 1, wherein the base current control circuit includes:

an inverter circuit for inverting a level of the input pulse signal and a differentiating circuit for differentiating an output signal of the inverter circuit and outputting the differentiated signal as a current to the base of the second transistor.

7. A pulse output circuit according to claim 6, further comprising a level adjusting circuit which adjusts the level of the output signal of the inverter circuit at a preceding stage of the differentiating circuit.

8. A pulse output circuit according to claim 6, wherein the differentiating circuit includes first and second differentiating circuits which differentiate the output signal of the inverter circuit and independently output the differentiated signals as currents to the bases of the second and third transistors.

9. A pulse output circuit according to claim 8, further comprising first and second level adjusting circuits which adjust the level of the output signal of the inverter circuit at a preceding stage of the first and second differentiating circuits.

* * * * *